United States Patent [19]

Cho

[11] 4,181,544
[45] Jan. 1, 1980

[54] MOLECULAR BEAM METHOD FOR PROCESSING A PLURALITY OF SUBSTRATES

[75] Inventor: Alfred Y. Cho, New Providence, N.J.

[73] Assignee: Bell Telephone Laboratories, Incorporated, Murray Hill, N.J.

[21] Appl. No.: 956,066

[22] Filed: Oct. 30, 1978

Related U.S. Application Data

[62] Division of Ser. No. 755,663, Dec. 30, 1976, Pat. No. 4,137,865.

[51] Int. Cl.² ................. H01L 21/203; C23C 13/08
[52] U.S. Cl. ................................. 148/175; 148/174; 156/612; 156/614; 156/DIG. 103; 427/86; 427/248 B
[58] Field of Search ............. 148/174, 175; 156/612, 156/614, DIG. 103; 427/86, 87, 248 B; 204/298; 118/49, 49.1, 49.5

[56] References Cited

U.S. PATENT DOCUMENTS

| | | | |
|---|---|---|---|
| 3,915,765 | 10/1975 | Cho et al. | 148/175 |
| 4,071,383 | 1/1978 | Nagata et al. | 148/175 |

OTHER PUBLICATIONS

Barber, G. F., "Two-Chamber Air-to-Vacuum Lock System", IBM Tech. Discl. Bull., vol. 11, No. 7, Dec. 1968, pp. 757–758.
Salama et al., "Structure . . . Evaporated Silicon Films on Sapphire", Solid-State Electronics, vol. 10, 1967, pp. 339–351.
Smith, D. L., "Molecular Beam Epitaxy . . . Waveguides", ARPA Tech. Report, AD-778354, 1974, pp. 5–6 and 23.
Smith et al., "Molecular Beam Epitaxy of II–VI Compounds", J. Applied Physics, vol. 46, No. 6, Jun. 1975, pp. 2366–2374.

Primary Examiner—L. Dewayne Rutledge
Assistant Examiner—W. G. Saba
Attorney, Agent, or Firm—Michael J. Urbano

[57] ABSTRACT

Apparatus for molecular beam deposition sequentially on a plurality of substrates is described. The apparatus includes a growth chamber and an auxiliary (sample-exchange) chamber coupled by an air-lock. The substrates are carried by a rod which can be translated via a bellows mechanism between the two chambers. The auxiliary chamber includes a port which permits access to the samples so that the entire rod-bellows mechanism need not be removed in order to change samples. The auxiliary chamber also includes means for maintaining therein an inert atmosphere at a pressure in excess of atmospheric pressure especially when the port is open. The growth chamber includes a cylindrical liquid nitrogen (LN$_2$) shroud which has an aperture in its wall to admit molecular beams to only a heated (growth) substrate. The unheated (idle) substrates are thus shaded from the beams. In addition, the shroud surrounds both the growth substrate and idle substrates in the growth chamber. This configuration of the shroud reduces the likelihood of contamination of idle substrates. In addition, the growth chamber includes means for selectively heating the growth substrate, the idle substrates remaining unheated so as to reduce the evaporation of high vapor pressure elements therefrom.

Another aspect of the invention is the provision of uniquely designed pyrolytic BN effusion cells for generating the various molecular beams.

3 Claims, 4 Drawing Figures

MOLECULAR BEAM METHOD FOR PROCESSING A PLURALITY OF SUBSTRATES

This application is a division of application Ser. No. 755,663, filed Dec. 30, 1976, now U.S. Pat. No. 4,137,865 and was concurrently filed with another division entitled "Effusion Cells for MBE Apparatus."

BACKGROUND OF THE INVENTION

This invention relates to the molecular beam deposition of semiconductor materials under ultra-high vacuum conditions, and, more particularly, to the sequential deposition of such materials on a plurality of substrates, and to unique effusion cells for use in the process.

As pointed out in a review paper by J. R. Arthur and myself (Progress in Solid-State Chemistry, Vol. 10, Part 3, pp. 157–191, Pergamon Press 1975), molecular beam epitaxy (MBE) is a term used to denote the epitaxial growth of semiconductor films by a process involving the reaction of one or more thermal molecular beams with a crystalline surface under ultra-high vacuum conditions. In comparison to simple vacuum-evaporation, MBE offers much improved control over the incident atomic or molecular fluxes so that differences between the sticking coefficients of the beam species can be taken into account. Use of shutter mechanisms and relatively slow growth rates (e.g., 1 μm/hr.) allow rapid changing of beam species and growth of layers as thin as a monolayer (2.8 Å for GaAs).

In addition, since electrically active impurities are added to the growing film by means of separate beams, the doping profile normal to the surface can be varied and controlled with a spatial resolution difficult to achieve by more conventional, faster growth techniques such as CVD and LPE.

MBE has been used to fabricate films of a variety of materials: Group III–V compounds, principally GaAs and AlGaAs, as well as Group II–VI and IV–VI materials (e.g., CdTe and PbS). Research also has extended to elemental materials such as Si but to date has met with, at best, mixed results. Molecular beam deposition is not limited, however, to epitaxial growth on single crystal substrates—high resistivity, polycrystalline GaAs layers have been deposited on amorphous substrates such as $SiO_2$.

In the GaAs-AlGaAs system MBE has been successfully employed to fabricate a number of device structures: IMPATT diodes, microwave mixer diodes, double heterostructure junction lasers, optical waveguides and superlattices. Fabrication took place, however, in either a research environment or a low-volume production facility so that processing of a single substrate (which can typically accommodate hundreds of devices) at a time was adequate.

It is, however, a broad object of my invention to sequentially process a plurality of substrates in an MBE apparatus suitable for relatively high volume production.

SUMMARY OF THE INVENTION

In accordance with an illustrative embodiment of my invention, molecular beam apparatus for processing a plurality of substrates comprises an evacuable growth chamber including a plurality of ovens for generating molecular beams directed to a growth position therein, an evacuable auxiliary (sample-exchange) chamber, an air lock which either isolates the chambers or places them in communication with one another, and carrier means for moving the substrates between the chambers and sequentially to the growth position, CHARACTERIZED IN THAT: the growth chamber includes (1) a cryogenic cooling shroud which surrounds all of the substrates in the growth chamber and which has an aperture to admit the molecular beams to the growth position, and (2) means for selectively heating the substrates so that only the substrate in the growth position (the growth substrate) is heated—the other (idle) substrates being unheated. The shroud configuration reduces contamination of the idle substrates by confining the beam spread via the aperture and by placing the idle substrates in a cryogenic surrounding so that reflected species of the beams are adsorbed by the shroud. On the other hand, leaving idle substrates unheated reduces the evaporation of high vapor pressure elements from those substrates.

In another embodiment, my invention is further characterized in that: the auxiliary chamber includes (3) a port which permits access to the substrates and (4) means for maintaining a positive pressure therein (with respect to the ambient) when the port is open. Preferably an inert gas such as dry nitrogen or argon is pumped into the auxiliary chamber to create the positive pressure. These features enable the substrates to be exchanged, inspected, etc. while the air lock is closed without admitting ambient contamination (e.g., water vapor, hydrocarbons) into the auxiliary chamber and hence onto the processed substrates, and without having to remove the entire carrier mechanism. This mechanism, which is illustratively a rod-bellows arrangement secured to a port cover, tends to be heavy and bulky and thus difficult to handle.

A third aspect of my invention is the provision of a unique pyrolytic BN (boron nitride) effusion cell which can be used in either single-substrate or multiple-substrate systems. The cell comprises an elongated, cylindrical, pyrolytic BN crucible surrounded by a heating coil. A plurality of ceramic rods, notched along their length, hold the wires in place against the crucible. Knurled foil surrounds the entire assembly as a radiation heat shield.

BRIEF DESCRIPTION OF THE DRAWING

These and other objects of my invention, together with its various features and advantages, can be readily understood from the following more detailed description taken in conjunction with the accompanying drawing, in which:

FIG. 2 is not shown to be precisely a cross-section of FIG. 1;

DETAILED DESCRIPTION

Apparatus

Figure 1:
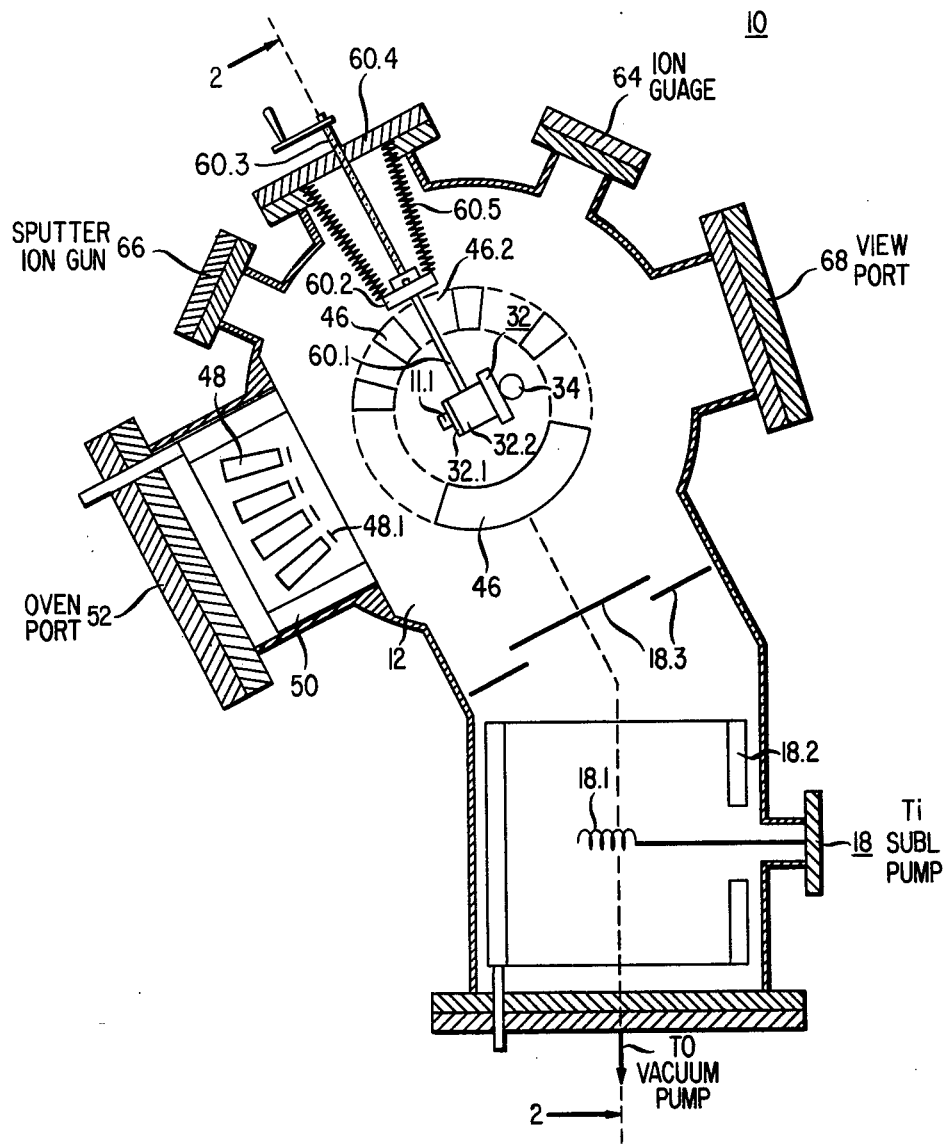
FIG. 1 is a schematic end view of molecular beam apparatus in accordance with one embodiment of my invention.
Figure 2:
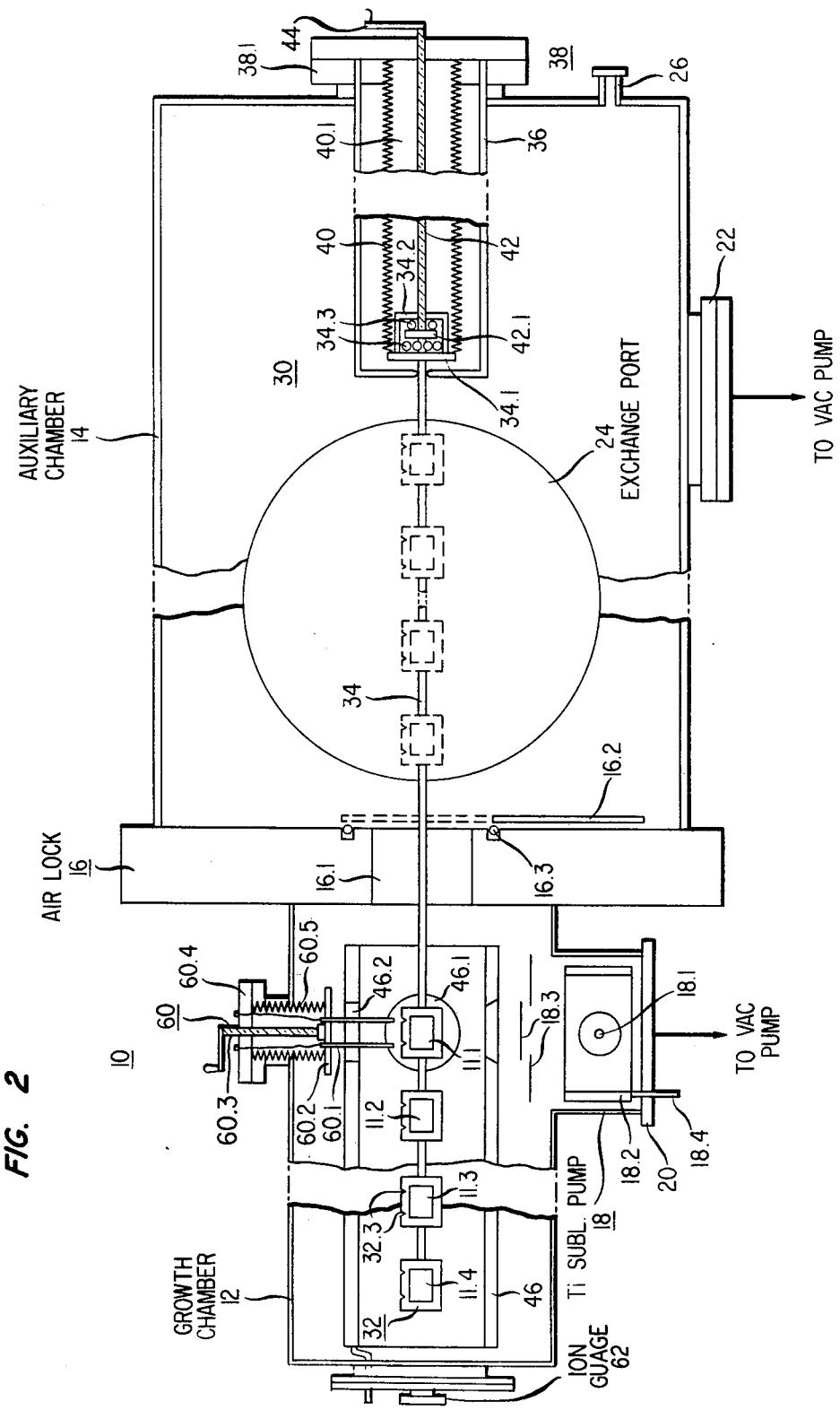
FIG. 2 is a schematic side-view taken along line 2—2 of FIG. 1, but for simplicity

With reference now to FIGS. 1 and 2, there is shown ultra-high vacuum apparatus 10 for the molecular beam deposition of layers of semiconductor materials sequentially on a plurality of substrates 11.1–11.4. The apparatus 10, which is typically made of stainless steel, comprises an evacuable growth chamber 12, an auxiliary (sample-exchange) chamber 14 and means, such as air lock 16, for alternately isolating the chambers from one another and placing them in communication with one another. Air lock 16 serves these functions by means of channel 16.1 which extends between the two chambers in conjunction with a gate 16.2 which can be moved (by means not shown) into place to block the channel 16.1. When so placed, gate 16.2 is pressed against O-ring 16.3 to form a vacuum seal, thus isolating the two chambers. Isolation is further enhanced by the fact that a higher vacuum is maintained in growth chamber 12 when the gate 16.2 is closed which tends to draw the gate against the O-ring. As will become apparent hereinafter, this configuration of coupled chambers means that growth chamber 12 need not be pumped down from atmospheric pressure to a high vacuum (e.g., $10^{-8}$ Torr) after deposition on each set of substrates is completed, thereby reducing both the system down-time as well as contamination of the growth chamber.

Vacuum conditions are achieved and maintained in the growth chamber 12 by suitable pumping means, typically a Ti sublimation pump 18 coupled to a commercially available vacuum pump (not shown), preferably an oil-free one such as an ion pump. The sublimation pump 18 includes a Ti element 18.1 positioned within a cryogenically cooled shroud 18.2. A plurality of spaced baffles 18.3 block line-of-sight paths between element 18.1 and the substrates. A cryogenic fluid, such as liquid nitrogen ($LN_2$), is pumped through the hollow walls of shroud 18.2 via inlet 18.4 which extends through port cover 20 to the exterior.

In the auxiliary chamber 14, on the other hand, the pumping means is considerably simpler. A sublimation pump is not required. Rather, another commercially available oil-free vacuum pump is coupled to the chamber 14 via port 22. Of course, it is apparent that this pump and the one used to pump the growth chamber 12 can be one and the same, in which case suitable valves would be employed to switch the pump from one chamber to another (or to both).

The auxiliary chamber 14 also includes an exchange port 24 which permits access to the interior thereof, especially when gate 16.2 is closed to isolate the growth chamber from the auxiliary chamber. This port allows the substrates to be exchanged for fresh substrates after growth is completed, or after some intermediate point in the growth sequence which is to be followed by further processing (e.g., etching, oxide deposition, masking) in another facility. In addition, to prevent contamination (principally by water vapor and hydrocarbons) of fresh substrates prior to layer growth, means is provided for maintaining the auxiliary chamber 14 under a positive pressure (with respect to the exterior or ambient). This means is depicted by inlet 26 through which a noncorrosive gas such as dry nitrogen or argon is pumped from a commercially available source (not shown).

Within the auxiliary chamber 14 carrier means 30 moves the substrate 11.1 to 11.4 between the auxiliary and growth chambers. Means 30 illustratively comprises a rod-bellows mechanism in which each substrate is mounted on a holder 32 which in turn is secured to a rod 34. A U-shaped retainer or guide 36 supports the rod 34 and itself is secured to the cap 38.1 of port 38. A bellows 40 is secured between a base plate 34.1 at the end of rod 34 and the same cap 38.1, thereby forming a vacuum seal so that the interior 40.1 of the bellows is essentially at atmospheric pressure but the exterior is at the auxiliary chamber pressure.

In order to translate rod 34 without breaking the vacuum, the side of base plate 34.1 interior to the bellows 40 is provided with an apertured support member 34.2. A second rod 42 is threaded through port 38 and is attached to a handle 44 (or to suitable automatic means for rotation) exterior to the chamber. The other end of rod 42 terminates in a second base plate 42.1 interior to support member 34.2. In order to facilitate rotation base plate 42.1 is separated from base plate 34.1 and the apertured wall of support member 34.2 by suitable friction-reducing means such as ball-bearings 34.3.

As mentioned previously, the substrates are mounted on suitable holders 32. In FIG. 1, substrate 11.1, for example, is indium soldered to a molybdenum slab 32.1 which in turn is secured to a molybdenum heating block 32.2. Block 32.2 is then mounted on rod 34. Each block 32.2 has a pair of electrical contacts 32.3 depicted by notches in FIG. 2 so that the substrates can be selectively heated to the growth temperature.

Selective heating is achieved by means of a second, but simpler, bellows mechanism 60 in which a pair of elongated contact fingers 60.1 are carried by base plate 60.2. The fingers 60.1 are translated through aperture 46.2 in shroud 46 by rod 60.3 which is threaded through cap 60.4 and is rotatably mounted to base plate 60.2. As before a bellows 60.5 is attached to cap 60.4 and plate 60.2 to form a vacuum seal. By selectively heating only the growth substrate (i.e., the substrate in the growth position), surface damage caused by evaporation of high vapor pressure elements from compound materials (e.g., As from GaAs) is virtually eliminated.

Although two contact fingers are shown, it is apparent that, if the system were suitably grounded electrically, a single contact would be adequate.

Within the growth chamber 12, each substrate is translated past a growth position defined by an aperture 46.1 in a second $LN_2$ shroud 46. This aperture is aligned to face a plurality of heatable ovens 48 from which the molecular beams emanate when shutters 48.1 are opened. These ovens (i.e., guns, Knudsen cells) are surrounded by a third $LN_2$ shroud 50 within oven port 52. Preferably, ovens 48 are positioned so that none is oriented either at an angle above horizontal (to avoid having source material therein fall out) or at an angle near vertical (to reduce "popping" or bursting of high vapor pressure components of compound semiconductor materials, e.g., As bursting through GaAs covered with Ga, and to reduce the likelihood that beam species which adhere to the shutters will fall back into the ovens).

Figure 4:
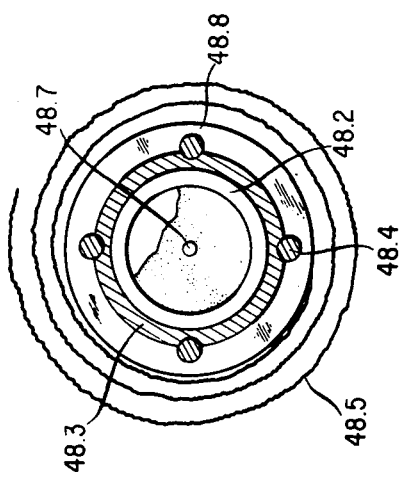
FIG. 4 is a view taken along line 4—4 of FIG. 3.
Figure 3:
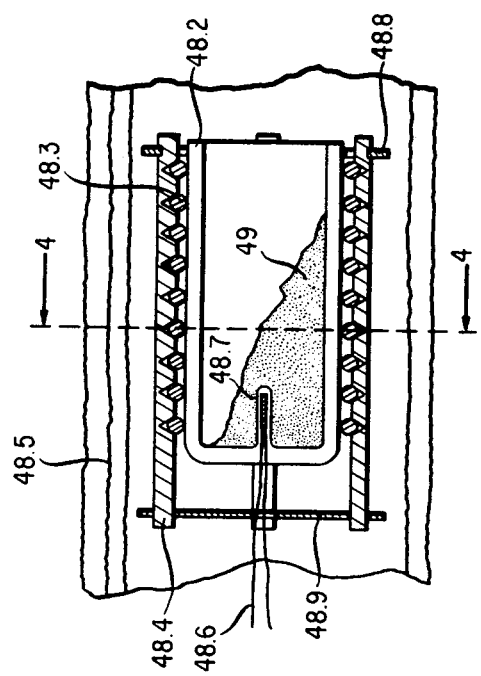
FIG. 3 is a cross-sectional view of an effusion cell in accordance with another aspect of my invention.

A unique effusion oven in accordance with another aspect of my invention is schematically shown in FIGS. 3 and 4. It comprises an elongated, cylindrical crucible 48.2 typically made of a high purity, refractory material such as pyrolytic BN. One end is open to permit egress of a molecular beam evaporated from source material 49. The crucible 48.2 is heated with a spiral heater winding 48.3 (e.g., Ta or W wire) which is firmly pressed onto the crucible by a set of ceramic (e.g., $Al_2O_3$) rods 48.4 notched along their length. The rods are secured by a retaining ring 48.8 at the front and an apertured disk 48.9 at the back. The whole assembly is wrapped a plurality of times with layers of knurled foil 48.5 (e.g., Ta, W) which act as a radiation heat shield. The temperature of the effusion oven is measured by a pair of thermocouples 48.6 inserted in a dimple 48.7 formed on the closed end of the crucible 48.2.

This type of effusion oven is useful with a variety of source materials, especially Al which tends to crack crucibles made of graphite.

It is important to note that shroud 46 is at least coextensive with the zone defined by all of the substrates when they are simultaneously in the growth chamber 12. That is, shroud 46 surrounds both the growth substrate (e.g., substrate 11.1) as well as the idle substrates (e.g., 11.1–11.3) in the growth chamber. Thus, molecular beam species which are reflected from the growth substrate (or heating block) tend to adhere to the cryogenically cooled shroud 46 rather than continuing to be reflected within the chamber. This configuration in conjunction with aperture 46.1, which tends to confine the beams to the growth substrate, cooperates to reduce contamination of the idle substrates.

The growth chamber 12 has a number of other ports adapted to accommodate a variety of equipment used to monitor growth and vacuum conditions. In FIG. 2, ion guage 62 monitors the background pressure. In FIG. 1, on the other hand, ion guage 64 is used to monitor the beam flux. Sputter ion gun 66 is optional and is used to clean the substrate surface. Generally, the native oxide technique mentioned hereinafter is sufficient, but if for some reason the substrate is subsequently contaminated, then sputtering can be used to produce an atomically clean growth surface. View port 68 is also optional and of course permits visual observation of the substrates. In each case, shroud 46 has suitable apertures so that a line-of-sight path is established between the substrate and the particular equipment.

It is to be understood that the above-described arrangements are merely illustrative of the many possible specific embodiments which can be devised to represent application of the principles of the invention. Numerous and varied other arrangements can be devised in accordance with these principles by those skilled in the art without departing from the spirit and scope of the invention.

In particular, instead of translating the rods through the growth position by the rod-bellows mechanism of FIG. 2, it is also possible to carry the substrates on a spoke-like apparatus; i.e., the spokes emanate from a rod, the substrates are mounted on the ends of the spokes, and the rod is rotated to sequentially place the substrates in the growth position.

Either type of mechanism for moving substrates to the growth position could readily be provided with a lock-in or stepping feature which automatically stops successive substrates at the growth position.

Process Steps

In operation of the above-described apparatus it will be assumed initially that both the growth chamber and the auxiliary chamber are at atmospheric pressure. The following then is a typical sequence of process steps utilized to fabricate epitaxial layers of GaAs on GaAs substrates.

(1) The substrates are first prepared to remove surface contamination preferably by the native oxide process described in my U.S. Pat. No. 3,969,164.

(2) The substrates are then indium soldered to molybdenum slabs and mounted through exchange port 24 onto the rod 34.

(3) One of the ovens 48 is filled with liquid Ga and the other with polycrystalline GaAs (primarily to provide a source of arsenic). Alternatively, arsenic can be supplied from a gaseous state by means of a separate container located exterior to the chamber. The other ovens are optional and can be used, for example, as a source of Al to grow AlGaAs or as a source of Sn and Mg to produce n- and p-type conductivity respectively in the GaAs or AlGaAs layers.

(4) With gate 16.2 open and exchange port 24 closed, an oil-free sorption pump is utilized to reduce the pressure in both chambers to about $10^{-3}$ and $10^{-4}$ Torr. This step typically takes about half an hour.

(5) Next, an ion pump, or the equivalent, is used to reduce the pressure of both chambers to about $10^{-7}$ to $10^{-8}$ Torr. This step typically takes a few hours. It should be noted that the ion pump remains on at all times in the growth chamber, but when gate 16.2 is closed it may be turned off in the auxiliary chamber.

(6) The titanium sublimation pump is then flashed so that titanium is deposited on the interior surface of shroud 18.2, thereby reducing the pressure of both chambers from about $10^{-8}$ to $10^{-9}$ Torr.

(7) The ovens are actuated by heating them to a temperature which is 10°–20° C. above the oven temperature utilized for growth. For example, the Ga gun would be heated to about 995° C. and the As gun would be heated to about 360° C.

Steps 4 through 7 are typically referred to as the pump-down process and are generally not repeated unless for some reason the growth chamber has been brought to atmospheric pressure. The following sequence of steps is termed the growth process.

(8) The rod-bellows mechanism is activated to move the substrates from the auxiliary chamber into the growth chamber.

(9) Optionally argon gas can be introduced into the growth chamber to a pressure of about $10^{-4}$ Torr and the sputter ion gun 66 can be actuated for about one-half to one hour in order to further clean the substrate surfaces. The argon gas is then pumped out of the chambers.

(10) The shrouds 46 and 50 are filled with liquid nitrogen which tends to trap contaminants on the cooled shroud surfaces, thereby reducing the pressure of both chambers to about $10^{-9}$ Torr.

(11) With the shutters 48.1 closed the ovens 48 are then lowered in temperature to the growth temperature.

(12) Next, the titanium sublimation pump is again flashed.

(13) The rod-bellows mechanism 60 is then actuated in order to bring contact fingers 60.1 into electrical contact with the heating blocks in the growth position. A voltage applied across contacts 60.2 causes current to flow through fingers 60.1 and a heating element (not shown) within the block, thereby heating the growth substrate to the growth temperature (e.g. 450°–650° C., typically 560° C.). At this point it should be noted that the background pressure in the growth chamber is about $10^{-6}$ Torr and is primarily caused by the presence of arsenic from the heated ovens. This background pressure is advantageous in reducing surface damage of the growth substrate which would be caused by the evaporation of arsenic therefrom. Because the idle substrates are not heated to the growth temperature, however, such evaporation from them is insignificant.

(14) In order to effect layer growth, the shutters are opened so that Ga and As beams are directed through aperture 46.1 in shroud 46 to the substrate in the growth position (e.g. substrate 11.1). Growth continues for a time period effective to grow a layer of the desired thickness. A typical growth rate is about 1 μm/hour.

(15) Each substrate is then sequentially moved into the growth position and steps 13 and 14 are repeated to effect layer growth on each.

(16) When growth on each of the substrates has been completed, the shutters 48.1 are closed and the temperature of the substrates as well as the ovens is lowered.

(17) Then the completed substrates are translated back into the auxiliary chamber by means of the rod-bellows mechanism.

(18) With the rod 34 and attached substrates fully retracted into the auxiliary chamber 14, the gate 16.2 is closed.

(19) Next, the auxiliary chamber is refilled with dry nitrogen and exchange port 24 is open.

(20) The substrates can now be removed from the auxiliary chamber (i.e., the substrates attached to the molybdenum slabs 32.1 are detached from the heating blocks 32.2) and fresh substrates can be mounted on the holders.

(21) The exchange port 24 is closed and the auxiliary chamber is pumped to a pressure of about $10^{-8}$ to $10^{-9}$ Torr.

(22) The gate 16.2 can now be opened and steps 8–21 repeated to effect growth of epitaxial layers on the fresh substrates. As mentioned previously, this process provides a relatively low system down-time because the growth chamber 12 is isolated from the auxiliary chamber during substrate exchange. Consequently, the growth chamber is not exposed to the atmosphere and the ovens need not be out-gased again.

What is claimed is:

1. In conjunction with apparatus which includes an evacuable growth chamber, an evacuable auxiliary chamber, gate means for alternately placing said chambers in communication with one another and for isolating said chambers from one another; a method for the molecular beam deposition of semiconductor material sequentially on a plurality of substrates comprising the steps of:

generating at least one molecular beam directed to a growth position within said growth chamber;

sequentially moving said substrates from said auxiliary chamber to said growth position for a time period effective to deposit thereon layers of said material of the desired thickness; characterized by:

selectively heating said substrates within said growth chamber so that only the substrate in said growth position (the growth substrate) is heated at any one time, the other (idle) substrates being unheated;

cryogenically cooling a surface which surrounds said growth position and all of said substrates within said growth chamber to reduce contamination of said idle substrates.

2. The method of claim 1 wherein said auxiliary chamber includes port means which can be opened to provide access to said substrates when said chambers are isolated from one another by said gate means; said method being further characterized by the steps of:

maintaining within said auxiliary chamber a positive pressure with respect to the exterior of said apparatus when said port means is opened.

3. The method of claim 2 wherein said pressure-maintaining step includes pumping a non-corrosive gas into said auxiliary chamber.

* * * * *